United States Patent
Myers et al.

(10) Patent No.: US 7,498,672 B2
(45) Date of Patent: Mar. 3, 2009

(54) MICROPIN HEAT EXCHANGER

(75) Inventors: Alan M. Myers, Menlo Park, CA (US); Ravi Prasher, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/903,185

(22) Filed: Jul. 30, 2004

(65) Prior Publication Data

US 2005/0104200 A1    May 19, 2005

Related U.S. Application Data

(63) Continuation-in-part of application No. 10/713,236, filed on Nov. 13, 2003, now Pat. No. 7,365,980.

(51) Int. Cl.
*H01L 23/34*    (2006.01)

(52) U.S. Cl. .................. 257/714; 257/706; 257/712; 257/E23.101

(58) Field of Classification Search .............. 257/706, 257/707, 712, 713, 714, E23.101
See application file for complete search history.

(56) References Cited

U.S. PATENT DOCUMENTS

| | | | | |
|---|---|---|---|---|
| 5,344,795 | A * | 9/1994 | Hashemi et al. ........ 264/272.15 |
| 5,587,880 | A * | 12/1996 | Phillips et al. ............... 361/687 |
| 5,666,269 | A | 9/1997 | Romero et al. |
| 5,796,049 | A * | 8/1998 | Schneider ................... 174/252 |
| 5,898,570 | A * | 4/1999 | Koon et al. .................. 361/704 |
| 6,578,626 | B1 * | 6/2003 | Calaman et al. ............ 165/80.4 |
| 6,653,730 | B2 * | 11/2003 | Chrysler et al. ............. 257/704 |
| 6,679,315 | B2 * | 1/2004 | Cosley et al. ............... 165/80.4 |
| 6,729,383 | B1 * | 5/2004 | Cannell et al. ............. 165/80.3 |
| 6,771,508 | B1 | 8/2004 | Ghosh |
| 6,820,684 | B1 * | 11/2004 | Chu et al. ............... 165/104.33 |
| 6,986,382 | B2 * | 1/2006 | Upadhya et al. ........... 165/80.4 |
| 7,365,980 | B2 | 4/2008 | Prasher |
| 2001/0027855 | A1 * | 10/2001 | Budelman ................. 165/80.3 |
| 2002/0185260 | A1 | 12/2002 | Calaman et al. |
| 2003/0136547 | A1 * | 7/2003 | Gollan et al. ........... 165/104.21 |
| 2004/0112571 | A1 * | 6/2004 | Kenny et al. ............... 165/80.3 |
| 2004/0206477 | A1 * | 10/2004 | Kenny et al. ............... 165/80.4 |
| 2005/0105272 | A1 | 5/2005 | Prasher |

FOREIGN PATENT DOCUMENTS

| | | |
|---|---|---|
| EP | 0542478 A1 | 5/1993 |
| JP | 01-087118 | 3/1989 |
| WO | WO-2005050737 A1 | 6/2005 |

OTHER PUBLICATIONS

"U.S. Appl. No. 10/713,236 Final Office Action mailed Mar. 8, 2006", 7 pages.

(Continued)

*Primary Examiner*—Nitin Parekh
(74) *Attorney, Agent, or Firm*—Schwegman, Lundberg & Woessner, P.A.

(57) ABSTRACT

An apparatus including a micropin thermal solution is described. The apparatus comprises a substrate and a number of micropins thermally coupled to the substrate.

42 Claims, 6 Drawing Sheets

OTHER PUBLICATIONS

"U.S. Appl. No. 10/713,236 Final Office Action mailed Jun. 5, 2007",7 pages.

"U.S. Appl. No. 10/713,236 Final Office Action mailed Jun. 22, 2006",7 pages.

"U.S. Appl. No. 10/713,236 Non-Final Office Action mailed Jan. 23, 2007",7 pages.

"U.S. Appl. No. 10/713,236 Non-Final Office Action mailed Jan. 4, 2005",6 pages.

"U.S. Appl. No. 10/713,236 Response filed Feb. 23, 2005 to Non-Final Office Action mailed Jan. 4, 2005",15 pages.

"U.S. Appl. No. 10/713,236 Response filed Apr. 23, 2007 to Non-Final Office Action mailed Jan. 23, 2007",14 pages.

"U.S. Appl. No. 10/713,236 Response filed Jun. 8, 2006 to Final Office Action mailed Mar. 8, 2006",15 pages.

"U.S. Appl. No. 10/713,236 Response filed Sep. 5, 2007 to Final Office Action mailed Jun. 5, 2007",13.

"U.S. Appl. No. 10/713,236 Response filed Aug. 31, 2006 to Final Office Action mailed Jun. 22, 2006",16 pages.

* cited by examiner

MICROPIN HEAT EXCHANGER

RELATED APPLICATION

This application is a continuation-in-part of U.S. patent application Ser. No. 10/713,236, filed Nov. 13, 2003, now U.S. Pat. No. 7,365,980, which is incorporated herein by reference.

TECHNICAL FIELD

The invention generally relates to cooling electronic apparatuses and systems, and in particular, but not exclusively relates to micro-cooling technology.

BACKGROUND INFORMATION

As electronic devices become more powerful and smaller (i.e., more densely packed), the power consumed by these electronic devices can result in a large amount of generated heat. The heat generated by these electronic devices may be detrimental to the operation of the electronic devices. Accordingly, a common concern associated with electronic components is heat removal.

For example, an electronic device may include an integrated circuit (IC) die. A thermal solution may be thermally coupled to the IC die to facilitate dissipation of heat from the IC die. Commonly, the thermal solution may be in the form of a heat sink having a number of fins or channels (i.e., a passive solution). As air passes by the fins or channels, heat may be transferred from the IC die to the surrounding air via the fins or channels. However, utilizing fins or channels does not provide efficient and uniform removal of heat from the IC die due to various effects such as, but not limited to, variations of heat generation from different areas on the IC die or the inability to transfer heat to a location, which is remote from the IC die.

BRIEF DESCRIPTION OF THE DRAWINGS

The various embodiments of the invention is illustrated by way of example and not by way of limitation in the figures of the accompanying drawings, in which the like references indicate similar elements and in which.

DETAILED DESCRIPTION

In various embodiments, an apparatus including a micropin thermal solution is described. In the following description, various embodiments will be described. However, one skilled in the relevant art will recognize that the various embodiments may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1A:
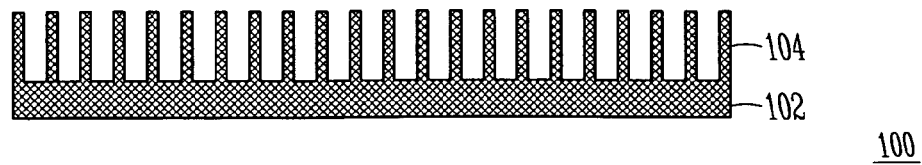
FIG. 1a-1b illustrate an apparatus having a micropin thermal solution, in accordance with one embodiment of the invention.
Figure 1B:
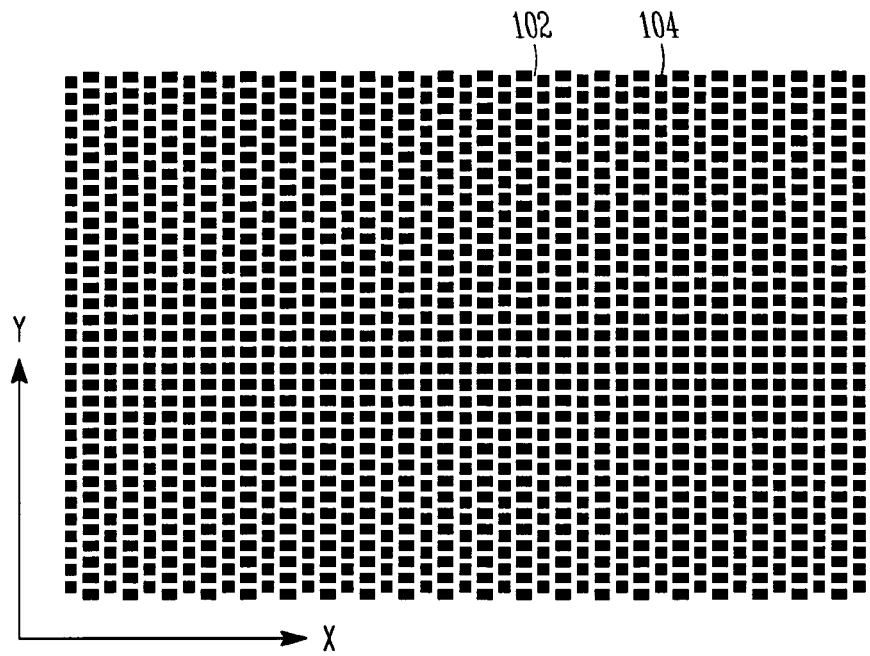

FIGS. 1a-1b illustrate an apparatus having a micropin thermal solution, in accordance with one embodiment of the invention. Illustrated in FIG. 1a is a side like view of an apparatus 100. In FIG. 1a, the apparatus 100 includes a substrate 102 and a number of micropins 104. FIG. 1b illustrates a top like view of the apparatus 100. Accordingly, as shown in FIG. 1b, the micropins 104 are arranged in a pixel like pattern over the substrate 102, in accordance with various embodiments of the invention.

Referring to FIG. 1b, the micropins 104 may be arranged to provide a predetermined space between the micropins 104. As will be described in more detail, the predetermined space may be based at least in part on the material that flows through the space such as, but not limited to water, glycol, oil, other liquids including alcohol that is in liquid form. Further, the micropins 104 arranged in the pixel like pattern shown in FIG. 1b facilitates flow of material in all directions such as, but not limited to, at least two directions (e.g., the x-direction and the y-direction) as viewed in FIG. 1b. Of course in other embodiments of the invention the micropins or pins could be staggered. In other embodiments the pins or micropins could be set in rows. Other patterns of pins or micropins are also contemplated.

In the illustrated embodiment shown in FIG. 1a, the micropins 104 may be formed from the substrate 102. That is, various etching methods may be utilized to form the micropins 104 from the substrate 102 such as, but not limited to, deep reactive ion etching (DRIE), wet etching, micromachining, and the like. Accordingly, the micropins 104 may be made of a semiconductor material, such as but not limited to silicon. Alternatively, the micropins 104 may be formed and disposed on the substrate 102. That is, the micropins 104 may be made of a variety of materials and methods such as, but not limited to, metals (e.g., copper) and micromachining methods, and subsequently disposed on the substrate. Additionally, the substrate 102 may be an integrated circuit (IC) die. Alternatively, the substrate 102 may be thermally coupled to an IC die.

The thermal energy (i.e., heat) from the substrate may be transferred to the micropins 104. Because in one embodiment, the micropins 104 are formed on the substrate 102, the micropins 104 may be thermally coupled to the IC die, and in turn, the micropins 104 facilitate transfer of heat to the material in substantial contact with the micropins 104. Alternatively, the micropins 104 may be thermally coupled to the substrate, which in turn, may be thermally coupled to an IC die. That is, effectively, the micropins 104 are thermally coupled to the IC die when attaching the pin grid device to the back of an IC die. The back of the IC die may be thinned by grinding, lapping and/or polishing, to reduce the thermal resistance between the front of the die where heat is generated and the pin grid device, and improve the heat removing capabilities of the pin-grid device.

Figure 2:
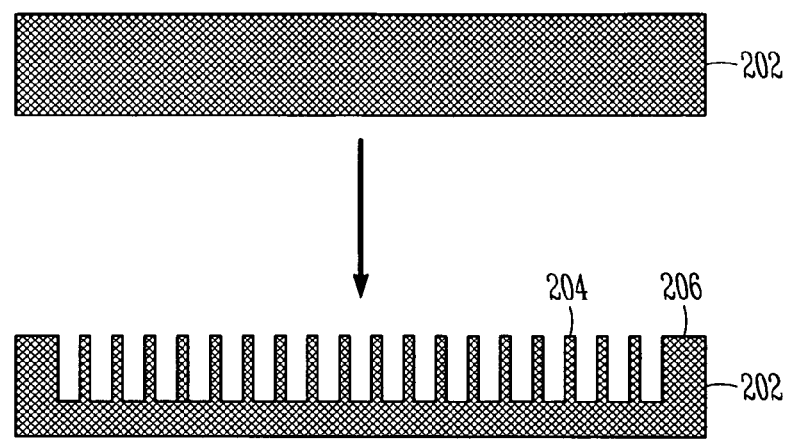
FIG. 2 illustrate a method of forming micropins, in accordance with one embodiment.

FIG. 2 illustrate a method of forming micropins, in accordance with one embodiment. Shown in FIG. 2 is a side like view of a substrate 202. The substrate 202 may be made of a suitable material to facilitate heat transfer such as, but not limited to, silicon based material, and a metal based material (e.g., silicon, copper, etc.). Various etching methods may be applied to the substrate 202 such as, but not limited to, DRIE, wet etching, micromachining, and so forth. As a result of the etching process, a number of micropins 204 may be formed from the substrate 202.

In the illustrated embodiment, formed along with the micropins 204 may be a side wall 206. As will be described in further detail, in various embodiments, the side wall 206 facilitates substantial enclosure of the micropins 204 within a device to facilitate heat removal from an integrated circuit (IC) die, and a cover may further facilitate the enclosure of the micropins 204.

Figure 3:
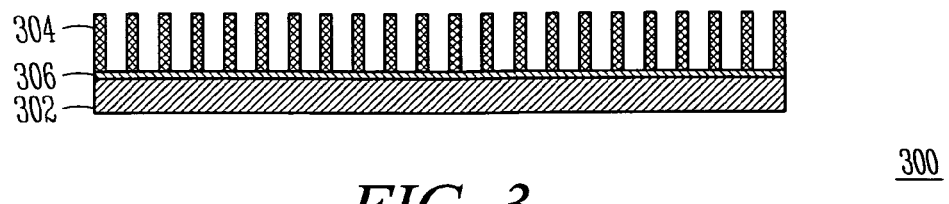
FIG. 3 illustrates an apparatus having a micropin thermal solution, in accordance with an alternate embodiment.

FIG. 3 illustrates an apparatus having a micropin thermal solution, in accordance with an alternate embodiment. In FIG. 3, a side like view is illustrated of an apparatus 300. The apparatus 300 includes a substrate 302 and a number of micropins 304 similar to the apparatus 100 shown in FIG. 1a-1b. However, illustrated in FIG. 3, the apparatus 300 includes an interface layer 306 disposed between the micropins 304 and the substrate 302.

In accordance with one embodiment, the interface layer 306 may be of a material to provide structural support for the micropins 304 and facilitate thermal coupling such as, but not limited to, a diamond film. As previously described, the micropins 304 may be made of a semiconductor material, and accordingly, the interface layer may provide structural support for the micropins 304 and facilitate thermal coupling (i.e., heat transfer) from the substrate 302 to the micropins 304. Here again, the substrate may be an IC die or a substrate that may be thermally coupled to an IC die.

In one embodiment, the interface layer 306 may be made of a solderable material having various thermal properties such as, but not limited to, copper (Cu), gold (Au), nickel (Ni), aluminum (Al), titanium (Ti), tantalum (Ta), silver (Ag), Platinum (Pt), Tin (Sn), Lead (Pb) and any combination thereof. Accordingly, in one embodiment, the micropins 304 may be made of a metal material such as, but not limited to, copper.

Continuing to refer to FIG. 3, it should be appreciated by those skilled in the relevant art that in addition to the interface material 306, various adhesive materials (not shown) may be utilized between the micropins 304 and the substrate 302.

Figure 4:
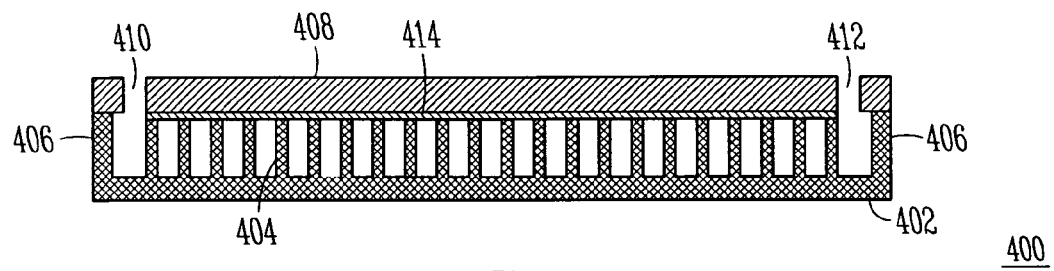
FIG. 4 illustrates an apparatus having a micropin thermal solution, in accordance with another embodiment.

FIG. 4 illustrates an apparatus having a micropin thermal solution, in accordance with another embodiment. Illustrated in FIG. 4, is a cross-sectional type view of an apparatus having a device 400. The device 400 includes substrate 402 and a number of micropins 404. As shown in the embodiment, the substrate 402 provides a bottom of the device 400. Additionally, the device 400 includes a wall 406 that substantially surround the micropins 404. Further, a cover 408 disposed over the micropins 404 results in the micropins 404 being substantially enclosed in the device 400.

The micropins 404 and the side wall 406 may both be formed from the substrate 402 as previously described in FIG. 2. The cover 408 may be attached to the micropins 404 by various attachment methods such as but not limited to, solder, adhesive, anodic bonding, thermal compression bonding, and so forth. Additionally, the cover may be made of various materials such as, but not limited to, acrylic based material (e.g., Plexiglas® from Rohm & Haas Corporation of Philadelphia, Pa.).

The device 400 has an inlet 410 and an outlet 412. As will be described in detail, the inlet 410 and the outlet 412 facilitates flow of material through the micropins 404. Additionally, in FIG. 4, an interface layer 414 is shown between the cover 406 and the micropins 404. The interface layer 414 may be any type of layer that facilitates a seal between the cover 406 and the micropins 404. Accordingly, the interface layer 414 may be of a solderable material, adhesive material, or any combination thereof.

Figure 5:
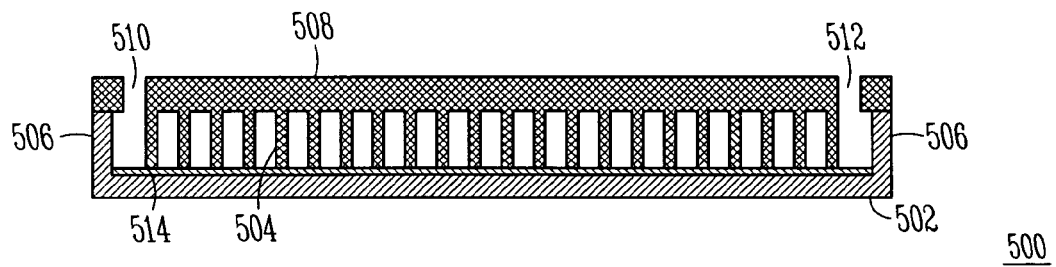
FIG. 5 illustrates an apparatus having a micropin thermal solution, in accordance with another embodiment.

FIG. 5 illustrates an apparatus having a micropin thermal solution, in accordance with another embodiment. Illustrated in FIG. 5, is a cross-sectional type view of an apparatus having a device 500. The device 500 includes a substrate 502 and a number of micropins 504. As shown in the embodiment, the substrate 502 provides a bottom of the device 500. Additionally, the device 500 includes a wall 506 that substantially surround the micropins 504 similar to the device 400 shown in FIG. 4. However, in the embodiment illustrated in FIG. 5, a cover 508 has the micropins 504 formed on the cover 508. Here again, the micropins 504 are substantially enclosed in the device 500.

The device 500 has an inlet 510 and an outlet 512. As will be described in detail, the inlet 510 and the outlet 512 facilitates flow of material through the micropins 504. Additionally, in FIG. 5, an interface layer 514 is shown between the micropins 504 and the substrate 502. The interface layer 514 may be any type of layer that facilitates a seal between the micropins 504 and the substrate 502. Accordingly, the interface layer 514 may be of a solderable material, adhesive material, or any combination thereof.

As previously alluded to, the cover 508 having the micropins 504 may be of any material such as, but not limited to, silicon and metal. Additionally, in the illustrated embodiment, the cover 508, having the micropins 504, may be formed as described in FIG. 2 (i.e., various etching methods).

In FIGS. 1-5, the number of micropins may be arranged in the pixel like pattern as shown in FIG. 1b. Additionally, as previously described, the substrate may be an IC die. Alternatively, the substrate may be a substrate that is thermally coupled to an IC die. It should be appreciated by those skilled in the art that the substrate and the micropins may be thermally coupled via various thermal interface materials (TIMs).

In one embodiment, each of the micropins may have the following approximate overall dimensions: 50 microns in width, 50 microns in thickness, and a height of 300 microns. The micropins width can range from 10-250 microns, the thickness can range from 10-250 microns and the thickness can be in the range of 10-500 microns. Referring to FIG. 1b, in one example arrangement, the pitch may be approximately 50 microns and the substrate may have approximate dimensions of 1 centimeter by 1 centimeter. The pins could be placed on larger or smaller substrates. Accordingly, in the example arrangement, the number of pins may be approximately 10000 micropins. The pitch of the pins can be in the range of 25-500 microns.

Various thermal and mechanical considerations may have an effect on the material utilized for the interface layer and/or the adhesive layer (not shown). For example, thermal considerations may include the coefficient of thermal expansion (CTE) considerations, thermal conductivity, and the like. Some mechanical considerations may include toughness, strength, and the like. Further, in various embodiments, the micropins 104 may be of any type of shape such as, but not limited to, a primitive geometric shape and a complex geometric shape. For example the micropins 104 may be cylindrical, rectangular, etc. including shapes without symmetry.

Figure 6A:
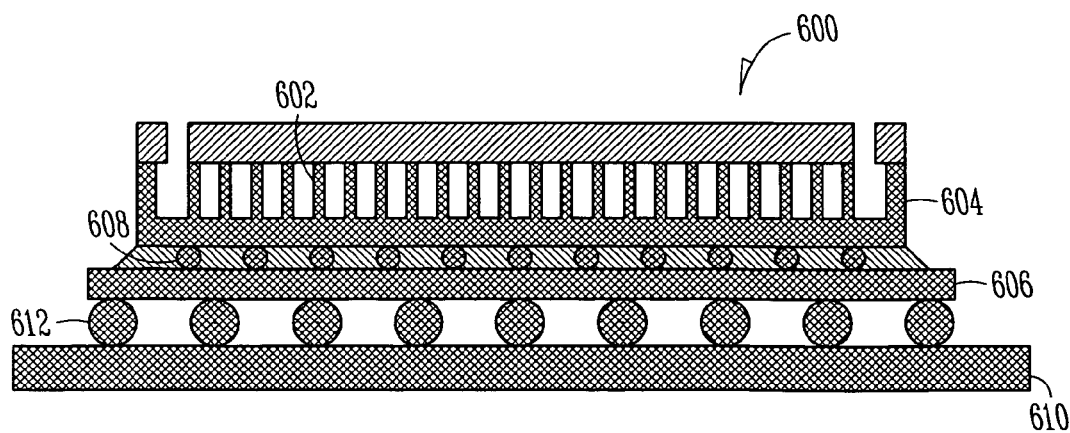
FIGS. 6a-6b illustrate an apparatus having a micropin thermal solution, in accordance with various embodiments.
Figure 6B:
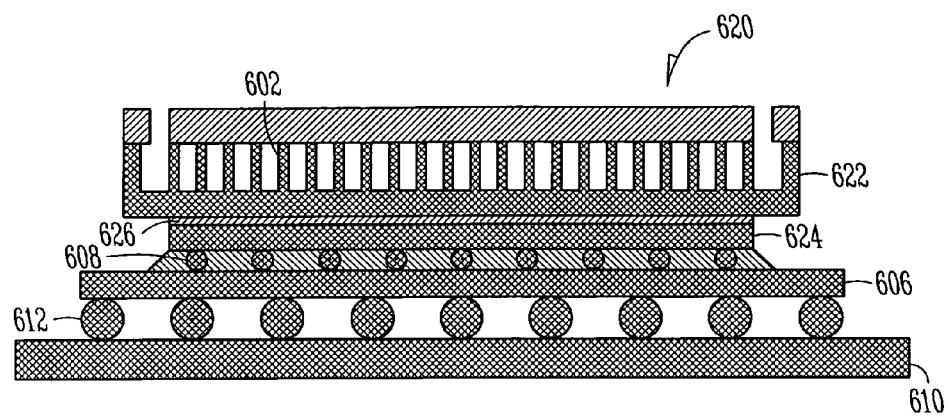

FIGS. 6a-6b illustrate an apparatus having a micropin thermal solution, in accordance with various embodiments. Illustrated in FIG. 6a is a cross-sectional type view of an electronic system 600 having apparatuses that may be representative of the apparatuses shown in FIGS. 1-5 having micropins 602. The electronic system 600 is shown having the micropins 602 disposed directly on top of an IC die 604 (i.e., the micropins 602 are thermally coupled to the IC die 604). The IC die 604 may be electrically coupled to a substrate 606 via a number of solder bumps 608. The substrate 606 may be electrically coupled to a wiring board 610 via solder balls 612. Accordingly, heat generated by the IC die 604 may be transferred to the micropins 602.

Turning now to FIG. 6b, shown in FIG. 6b is a cross-sectional type view of an electronic system 620 having apparatus 620 that may be representative of the apparatuses shown in FIGS. 1-5 having micropins 602. In FIG. 6b, the micropins 602 are shown thermally coupled to a substrate 622, which in turn may be thermally coupled to an IC die 624. Shown in FIG. 6b, an interface layer 626 may be disposed between the substrate 622 and the IC die 624. As previously alluded to, the interface layer 626 may be a TIM that facilitates thermal coupling of the substrate 622 with the IC die 626, thereby facilitating heat transfer from the IC die 626 to the micropins 602.

Continuing to refer to FIG. 6b, the apparatus 620 is shown thermally coupled to the IC die 622. The IC die may be electrically coupled to the substrate 606 via solder bumps 608. The substrate 606 may be electrically coupled to the wiring board 610 via solder balls 612. Here again, the heat generated by the IC die 622 may be transferred to the micropins 602 because effectively, the micropins 602 may be thermally coupled to the IC die 622.

Shown in FIGS. 6a-6b, the micropins 602 are substantially enclosed in the device 600 & 620. However, as described previously, the micropins 602 need not be substantially enclosed (see FIGS. 1-3). Additionally, in various embodiments, the wiring board 610 may have various devices electrically coupled to it such as, but not limited to a memory device (e.g., a flash memory device).

Figure 7A:
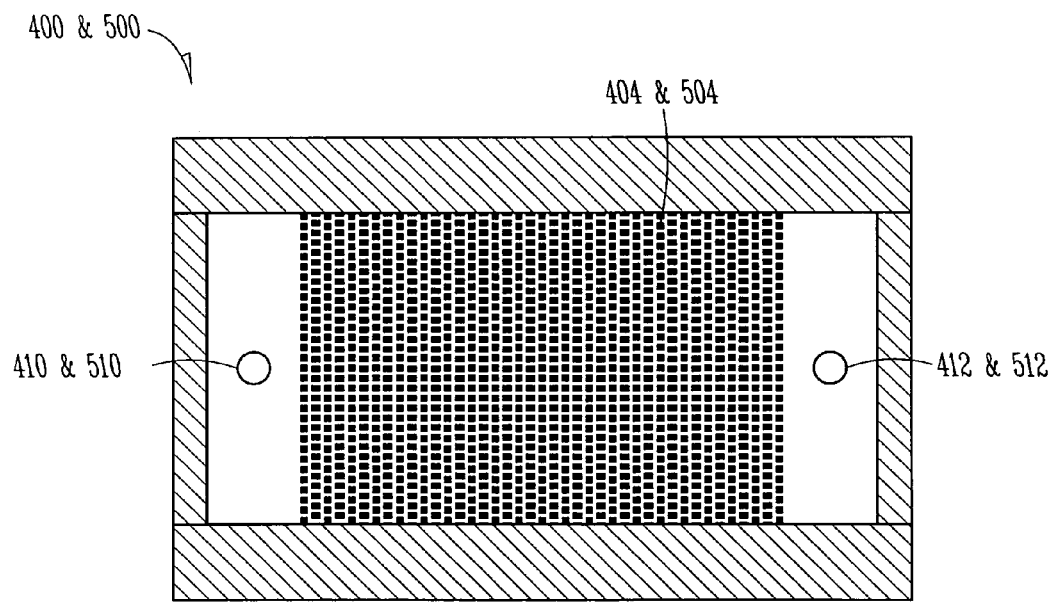
FIGS. 7a-7b illustrate a micropin thermal solution, in accordance with various embodiments.
Figure 7B:
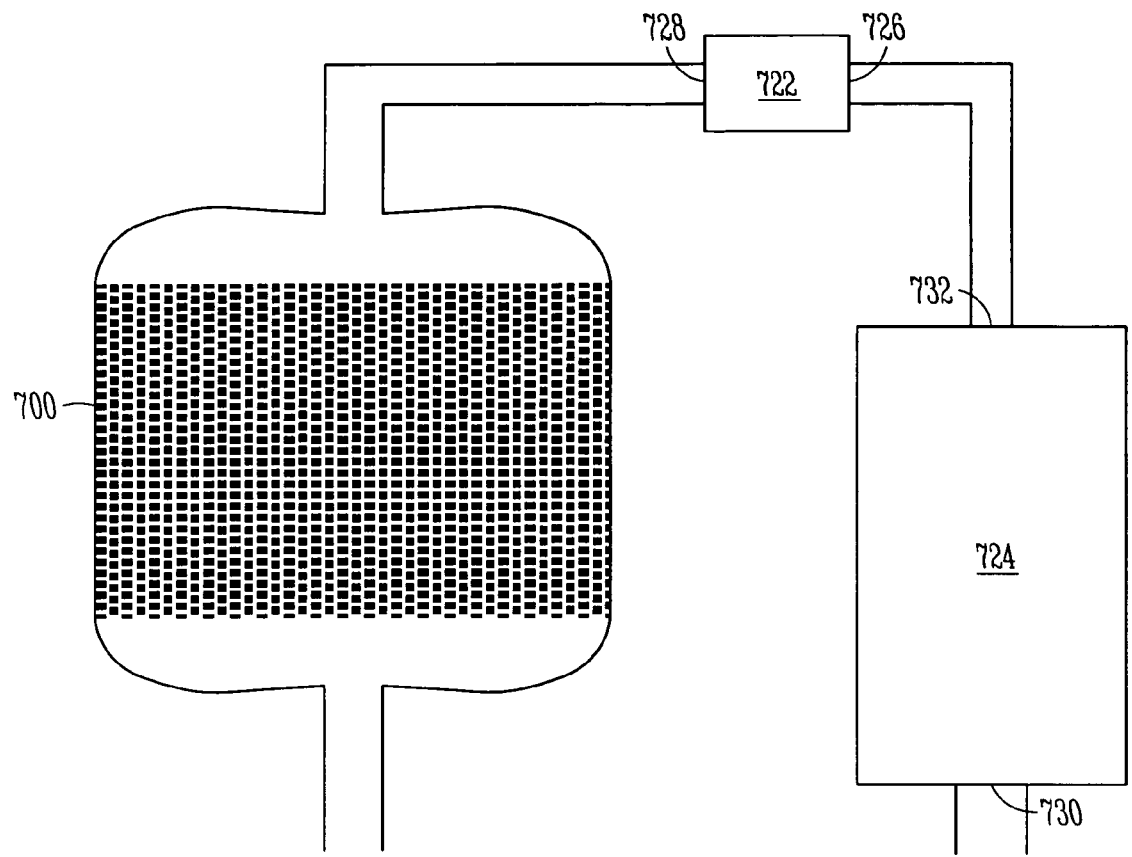

FIGS. 7a-7b illustrate a micropin thermal solution, in accordance with various embodiments. Illustrated in FIG. 7a is a top like view of an apparatus 700 that may be representative of the apparatuses shown in FIGS. 4-6. Accordingly, the apparatus has the number of micropins 404 & 504 substantially enclosed the device 400 & 500. Additionally, the device 400 & 500 has the inlet 410 & 510 and the outlet 412 & 512. As shown, the micropins 404 & 504 are arranged in the pixel like pattern as previously described.

Referring now to FIG. 7b, the apparatus 700 may be included in a heat exchange system. Shown in FIG. 7b is a simplified view of a heat exchange system 720. The heat exchange system 720 includes the apparatus 700, a pump 722, and a heat exchanger 724.

As previously described, the apparatus 700 has the inlet 410 & 510 and the outlet 412 & 512. The pump 722 has an inlet 726 and an outlet 728. The heat exchanger 724 has an inlet 730 and an outlet 732. As shown in FIG. 7, the outlet of the pump 728 may be coupled to the inlet 410 & 510 of the apparatus 700 (i.e., device) to facilitate transfer of material (i.e., material transferably coupled). The inlet 726 of the pump 728 may be material transferably coupled to the outlet 732 of the heat exchanger 724. The outlet 412 & 512 may be material transferably coupled to the inlet 730 of the heat exchanger 724.

As shown in FIG. 7b, a material such as, but not limited to, liquid water may be pumped to the apparatus 700. The micropins, being thermally coupled to an IC die, facilitate heat transfer to the liquid water. As more heat is transferred to the liquid water, the liquid water may become steam. Further, as varying areas of the IC die generate varying amounts of heat, utilization of micropins and the manner in which the micropins are arranged facilitates uniform cooling of the IC die.

The pump 722 and the heat exchanger 724 may be any type of pump and heat exchanger such as, but not limited to, an electroosmotic pump. Additionally, the material utilized for the heat exchange system 720 may be any material such as, but not limited to, fluid, gas, and nanoparticles.

In the illustrated embodiment of FIG. 7b, the pump 722 provides material to the apparatus 700. The apparatus facilitates removal of heat from an IC die, as previously described. The heat exchanger 724 receives the heated material and removes the heat to the surrounding environment. A fan may be used to assist in the flow of air over the heat exchanger in order to facilitate the transfer of heat from the heat exchanger to the surrounding environment. It should be appreciated that in order not to obscure the embodiments of the invention, various components of the heat exchange system 720 are not shown. For example, there may various valves, seals, and so forth.

Figure 8:
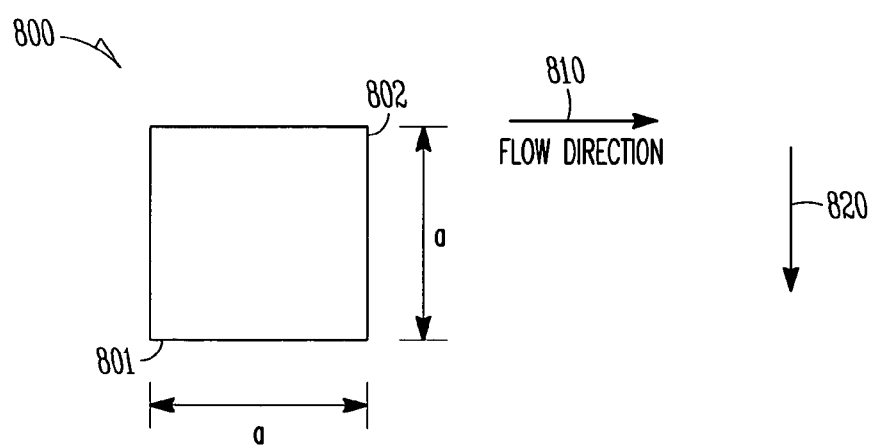
FIG. 8 illustrates a cross-sectional view of a micropin thermal solution, in accordance with an embodiment of the invention.

FIGS. 8-13 illustrate various cross-sectional views of a micropin, thermal solution, in accordance with an embodiment of the invention. FIG. 8 illustrates a cross-sectional view of a micropin or pin 800 in accordance with one embodiment of the invention. FIG. 8 shows one pin 800 positioned within the flow of a fluid. The direction of the fluid flow is depicted by the arrow 810. As discussed above, the fluid is also capable of flowing in a secondary direction, such as the direction depicted by arrow 820. The cross-sectional shape of the pin 800 is substantially square. The pin 800 has a first side 801 and a second side 802. Each of the first side 801 and the second side 802 has a dimension, a. According to an embodiment of the invention, the dimension a is in the range of 10 microns to 1,000 microns.

Figure 9:
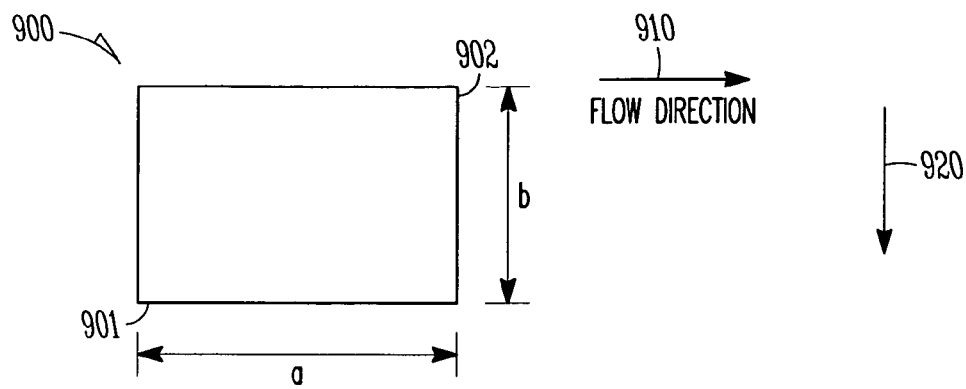
FIG. 9 illustrates a cross-sectional view of a micropin thermal solution, in accordance with another embodiment of the invention.

FIG. 9 illustrates the cross-sectional view of a micropin or pin 900, thermal solution, in accordance with another embodiment of the invention. The micropin or pin 900 includes a first side 901 and a second side 902. The side 901 has a dimension labeled a, while the second side 902 has a dimension depicted by b. The cross-sectional area of the pin 900 is substantially rectangular in shape and therefore the dimension a does not equal the dimension b. The dimensions for a and b are within the range of 10 microns to 1,000 microns. The pin 900 is also positioned within a primary flow, having a direction depicted by an arrow 910. As shown in FIG. 9, a fluid flowing in the direction 910 directly impacts a flat surface. Alternatively, the flat surface is substantially perpendicular to the flow direction 910.

Figure 10:
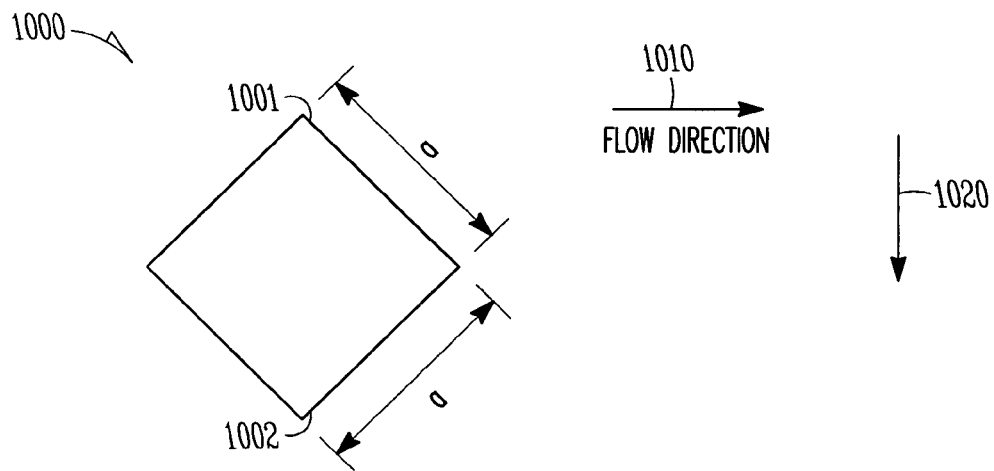
FIG. 10 illustrates a cross-sectional view of a micropin thermal solution, in accordance with yet another embodiment of the invention.

FIG. 10 is a cross-sectional view of a micropin thermal solution or pin 1000, in accordance with yet another embodiment of the invention. Pin 1000 has a side 1001 and a side 1002. The side 1001 has a dimension a and the side 1002 has a dimension depicted by a. Therefore, the pin 1000 is substantially square. The pin 1000 is positioned within a flow having a primary direction depicted by the arrow having the reference numeral 1010. The main difference between the pin 1000 and the pin 800 is that the pin 1000 is positioned within the primary direction 1010 such that at least two of the surfaces (opposite the side 1001 and opposite the side 1002) are contacted by an initial flow of fluid. In other words, the sides 1001 and 1002 form approximately a 45° angle with respect to the direction of flow. The dimension a for the pin 1000 ranges from 10 microns to 1,000 microns. As mentioned before, the primary direction of flow is in the direction 1010, as depicted by the arrow carrying that reference numeral. The flow direction can also go in a secondary direction, such as shown by the arrow 1020 in FIG. 10.

Figure 11:
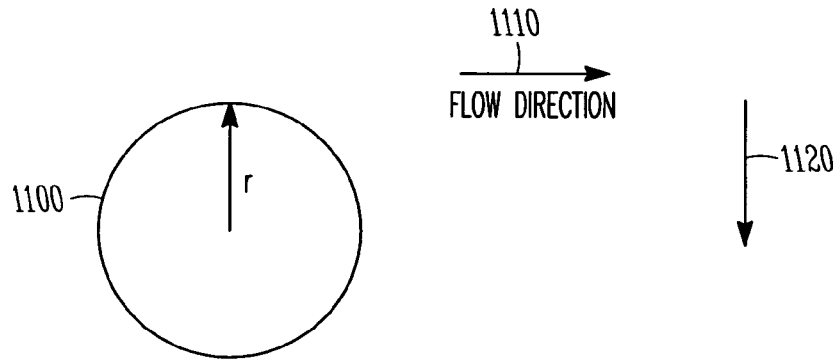
FIG. 11 illustrates a cross-sectional view of a micropin thermal solution, in accordance with still another embodiment of the invention.

FIG. 11 shows a cross-sectional view of a micropin thermal solution or pin 1100, in accordance with yet another embodiment of this invention. As shown in FIG. 11, the cross-section shape of the pin 1100 is substantially circular or round. The dimension of the substantially circular or round pin includes that the pin has a radius, r, in the range of 50 microns to 500 microns. The pin 1100 is positioned within a flow of fluid having a primary direction 1110 and a secondary direction 1120.

Figure 12:
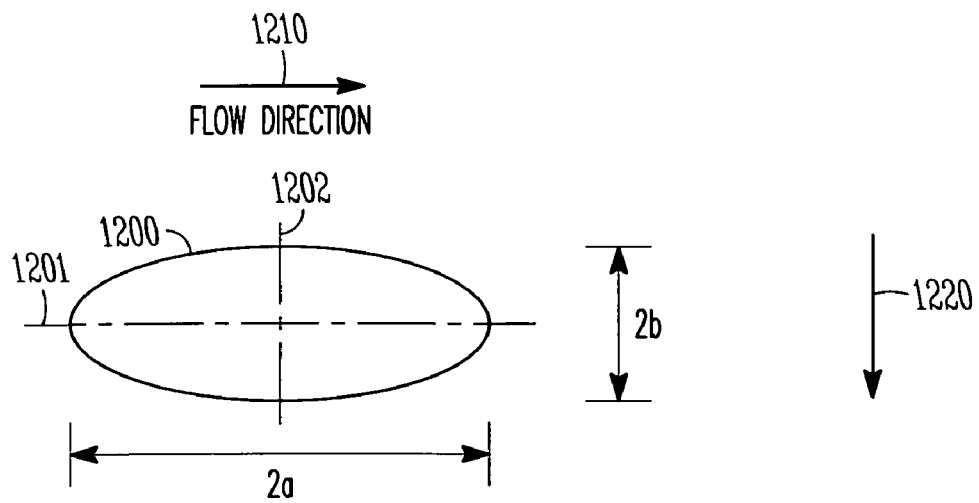
FIG. 12 illustrates a cross-sectional view of a micropin thermal solution, in accordance with an embodiment of the invention.

FIG. 12 illustrates a cross-sectional view of a micropin thermal solution or pin 1200, in accordance with another embodiment of the invention. The cross-sectional area of the pin is substantially elliptical. As shown in FIG. 12, the elliptical cross section 1205 has a major access 1201 and a minor access 1202. The major access 1201 has a dimension $2a$, and the minor access 1202 has a dimension $2b$. The dimensions of $2a$ and $2b$ are unequal. The dimensions $2a$ and $2b$ also are in a range from 10 microns to 1,000 microns. The pin 1200 is situated within a primary flow direction 1210. The elliptical cross section may be orientated either vertically or horizontally with respect to the primary flow direction 1210. It should also be noted that, if necessary, flow can also occur in a secondary direction, as depicted by the arrow 1220.

Figure 13:
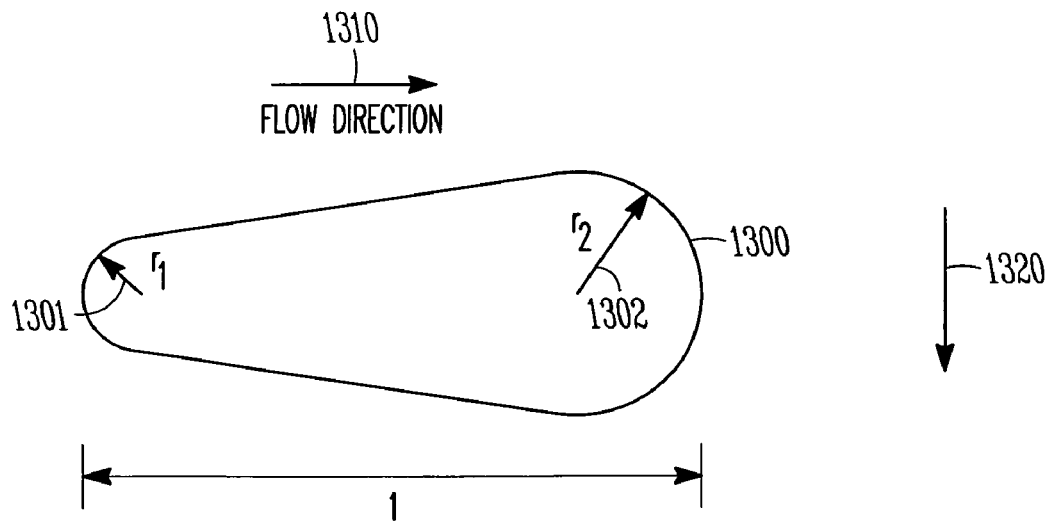
FIG. 13 illustrates a cross-sectional view of a micropin thermal solution, in accordance with an embodiment of the invention.

FIG. 13 illustrates a cross-sectional view of a micropin or pin 1300, in accordance with still another embodiment of the invention. The pin 1300 is essentially wedge shaped with rounded ends. A first end has a radius, $r_1$, 1301 and the second end has a radius, $r_2$, 1302. In some embodiments, $r_1$ can be substantially the same as $r_2$. In other embodiments, $r_1$ is different or unequal to $r_2$. The pin 1300 is positioned within a flow 1310. As shown in FIG. 13, the pin 1300 has the smaller radius end positioned toward the flow direction 1310. The pin 1300 also has a length l. The radius $r_1$ and $r_2$ range between 10 microns and 100 microns. Although the primary flow direction is depicted by reference numeral 1310, the flow is also capable of a secondary direction 1320. It should be noted that even though the secondary flow direction 820, 920, 1020, 1120, 1220, 1320 is shown perpendicular to a primary flow direction and directed downwardly, the secondary flow direction is not limited to the direction shown but can be any direction.

Also of note is that the various geometric shapes shown in FIGS. 8-13 are not meant to be limiting and that other shapes may be used for cross-sectional shapes of pins or micropins in a micropin thermal solution. The shapes are also positionable within a primary flow direction in any number of ways.

The pin depth is not limited to any one particular depth, especially when the plurality of pins is not fabricated in the back of an integrated circuit die. The maximum depth is limited by the mechanical strength of the remaining silicon when the pin grids are formed within the back of the integrated circuit die. When the pin grid is formed of a separate material, the depth is not limited. The minimum depth is related to the required flow rate and allowable pressure drop through the pin grid array that will still provide sufficient cooling or remove an appropriate amount of heat from the integrated circuit.

Having described and illustrated the principles of the invention with reference to illustrated embodiments, it will be recognized that the illustrated embodiments can be modified in arrangement and detail without departing from such principles. And, though the foregoing discussion has focused on particular embodiments, other configurations are contemplated. In particular, even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments.

Thus, it can be seen from the above descriptions, a novel apparatus including a micropin thermal solution has been described. The micropins allow for efficient 2-phase liquid cooling near a "hot-spot" where heat is generated on a chip when compared to channels. The pressure in a channel will increase when the liquid converts to a gas compared to the other channels of the microchannel device. Liquid preferentially flows in the channels with no pressurized gas. Since less liquid flows in the channel with gas, the cooling capability of this channel decreases. This is undesirable since this channel needs the most cooling. Pin grids avoid this since the water is not constrained within a channel and can move in two dimensions.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

Consequently, in view of the wide variety of permutations to the embodiments described herein, this detailed description is intended to be illustrative only, and should not be taken as limiting the scope of the invention. What is claimed as the invention, therefore, is all such modifications as may come within the scope and spirit of the following claims and equivalents thereto.

What is claimed is:

1. An apparatus comprising:
    a substrate;
    a plurality of micropins thermally coupled to the substrate, the plurality of micropins arranged in a pixel-like pattern over the substrate;
    a sidewall attached to the substrate and positioned around the plurality of micropins, wherein the pixel-like pattern of the micropins is adapted to cause a tortuous flow within the apparatus; and
    a substantially flat cover attached to the substrate, the cover having a substantially flat exterior surface and a substantially flat interior major surface, the flat cover further comprising an interface layer, the interface layer disposed between the plurality of micropins and the flat cover, the interface layer including portions disposing over an entire area of the cover that is between the plurality of micropins.

2. The apparatus of claim 1, wherein at least one of the plurality of micropins has a substantially square cross-sectional area.

3. The apparatus of claim 1, wherein the apparatus is adapted to receive the flow of a fluid from a direction, and wherein the at least one of the plurality of micropins having a substantially square cross-sectional area is positioned so that at least two sides of the at least one of the plurality of micropins is directed toward the flow.

4. The apparatus of claim 1, wherein at least one of the plurality of micropins has a substantially rectangular cross-sectional area.

5. The apparatus of claim 1, wherein at least one of the plurality of micropins has a substantially circular cross-sectional area.

6. The apparatus of claim 1, wherein at least one of the plurality of micropins has a substantially elliptical cross-sectional area.

7. The apparatus of claim 1, wherein at least one of the plurality of micropins has a substantially oblong cross-sectional area.

8. The apparatus of claim 1, wherein at least one of the plurality of micropins comprises:
    a first end having a first rounded portion with having a curve with a first radius; and
    a second end having a second rounded portion with having a curve with a second radius.

9. The apparatus of claim 1, wherein the substrate further comprises an integrated circuit (IC) die.

10. The apparatus of claim 1, wherein the plurality of micropins is formed from a portion of the substrate.

11. The apparatus of claim 1 further comprising:
    an inlet and
    an outlet.

12. The apparatus of claim 1, wherein the plurality of micropins is arranged to facilitate fluid flow across the plurality of micropins in at least a primary direction and a secondary direction.

13. The apparatus of claim 1 wherein the interface layer is adapted to be thermally coupled to the substrate and the plurality of micropins.

14. The apparatus of claim 1, wherein the plurality of micropins comprises a plurality of micropins substantially enclosed in a device.

15. The apparatus of claim 1, wherein the plurality of micropins comprises a plurality of micropins substantially enclosed in a device, the device adapted to receive the cover over the plurality of micropins.

16. The apparatus of claim 1, wherein the plurality of micropins is positioned to cause a fluid passing through the plurality of micropins to travel in at least two directions.

17. The apparatus of claim 16, wherein the plurality of micropins comprises a plurality of micropins arranged to facilitate flow of material across the plurality of micropins in at least an x direction and a y direction.

18. The apparatus of claim 16, wherein the plurality of micropins comprises a plurality of micropins arranged to facilitate flow of material across the plurality of micropins in a plurality of directions.

19. The apparatus of claim 16, wherein the plurality of micropins comprises a plurality of micropins arranged to facilitate flow of material across the plurality of micropins in more than two directions.

20. The apparatus of claim 1, wherein the cover and the side walls substantially enclose the micropins.

21. The apparatus of claim 1 wherein the interface layer provides structural support for the micropins.

22. The apparatus of claim 1 wherein the interface layer includes a film of diamond.

23. The apparatus of claim 1 wherein the plurality of micropins is formed and disposed onto the substrate.

24. The apparatus of claim 1 wherein the substrate is formed of a first material and a second material different from the first material of the substrate.

25. The apparatus of claim 1 wherein the cover is formed of an acrylic material.

26. The apparatus of claim 1 wherein the micropins have a height of approximately 300 microns.

27. The apparatus of claim 1 wherein the micropins have a width in the range of 10-250 microns.

28. The apparatus of claim 1 wherein the micropins have a thickness in the range of 10-500 microns.

29. The apparatus of claim 1 wherein the micropins have a pitch in the range of 25-500 microns.

30. The apparatus of claim 1 wherein the micropins have a shape without symmetry.

31. The apparatus of claim 1 further comprising:
    a heat exchanger in fluid communication with the apparatus; and
    a pump in fluid communication with the heat exchanger and the apparatus.

32. The apparatus of claim 1 wherein the substrate is thinned with respect to the original thickness of the substrate.

33. A heat exchange system comprising:
    a device having an inlet and an outlet, comprising:
        a substrate, and
        a plurality of pins thermally coupled to the substrate, the plurality of pins arranged to facilitate flow of a fluid in a primary direction and a secondary direction;
        a sidewall attached to the substrate and positioned around the plurality of pins; and
        a substantially flat cover attached to the substrate, the cover having a substantially flat exterior surface and a substantially flat interior major surface, the flat cover further comprising an interface layer, the interface layer disposed between the plurality of pins and the flat cover, the interface layer including portions disposing over an entire area of the cover that is between the plurality of pins.

34. The heat exchange system of claim 33, wherein at least one of the plurality of pins has a substantially square cross-sectional area.

35. The heat exchange system of claim 34, wherein the apparatus is adapted to receive the flow of a fluid from a direction, and wherein the at least one of the plurality of pins having a substantially square cross-sectional area is positioned so that at least two sides of the at least one of the plurality of pins is directed toward the flow.

36. The heat exchange system of claim 33, wherein at least one of the plurality of pins has a substantially rectangular cross-sectional area.

37. The heat exchange system of claim 33, wherein at least one of the plurality of pins has a substantially circular cross-sectional area.

38. The heat exchange system of claim 33, wherein at least one of the plurality of pins has a substantially elliptical cross-sectional area.

39. The heat exchange system of claim 33, wherein at least one of the plurality of pins has a substantially oblong cross-sectional area.

40. The heat exchange system of claim 33, wherein at least one of the plurality of pins comprises:
   a first end having a first rounded portion with having a curve with a first radius; and
   a second end having a second rounded portion with having a curve with a second radius.

41. The heat exchange system of claim 33, wherein the device encloses the plurality of pins, the device further comprising a cover for the plurality of pins.

42. The heat exchange system of claim 33, wherein the device comprises the cover having the plurality of pins formed thereon.

* * * * *

UNITED STATES PATENT AND TRADEMARK OFFICE
CERTIFICATE OF CORRECTION

PATENT NO. : 7,498,672 B2
APPLICATION NO. : 10/903185
DATED : March 3, 2009
INVENTOR(S) : Myers et al.

Page 1 of 1

It is certified that error appears in the above-identified patent and that said Letters Patent is hereby corrected as shown below:

In column 10, line 53, in Claim 33, after "arranged" insert -- in a pattern --.

Signed and Sealed this

Nineteenth Day of May, 2009

JOHN DOLL
*Acting Director of the United States Patent and Trademark Office*